United States Patent
Lien et al.

(10) Patent No.: US 9,720,771 B2
(45) Date of Patent: Aug. 1, 2017

(54) METHODS AND SYSTEMS FOR NONVOLATILE MEMORY DATA MANAGEMENT

(71) Applicant: Winbond Electronics Corp., Taichung (TW)

(72) Inventors: Chuen-Der Lien, Los Altos Hills, CA (US); Ming-Huei Shieh, Cupertino, CA (US); Chi-Shun Lin, Fremont, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/389,466

(22) Filed: Dec. 23, 2016

(65) Prior Publication Data

US 2017/0102994 A1 Apr. 13, 2017

Related U.S. Application Data

(63) Continuation of application No. 14/721,030, filed on May 26, 2015, now Pat. No. 9,563,505.

(51) Int. Cl.
*G11C 29/00* (2006.01)
*G06F 11/10* (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC ............. G06F 11/1068; G06F 11/1072; G06F 3/0679; G06F 3/0619; G11C 29/52
See application file for complete search history.

(56) References Cited

U.S. PATENT DOCUMENTS

| | | |
|---|---|---|
| 6,704,230 B1 | 3/2004 | DeBrosse et al. |
| 7,417,885 B2 | 8/2008 | Matsuno et al. |

(Continued)

FOREIGN PATENT DOCUMENTS

| | | |
|---|---|---|
| JP | 2007-141170 A | 6/2007 |
| JP | 2013-065261 A | 4/2013 |

(Continued)

OTHER PUBLICATIONS

Notice to Submit Response issued by Korean Intellectual Property Office on Jan. 17, 2017, in Korean Patent Application No. 10-2016-0010314.

(Continued)

*Primary Examiner* — Shelly A Chase
(74) *Attorney, Agent, or Firm* — Finnegan, Henderson, Farabow, Garrett & Dunner LLP

(57) ABSTRACT

A system includes a first nonvolatile memory array, a second nonvolatile memory array, and a memory controller. The memory controller is configured to write an indicator bit to the second nonvolatile memory array, determine whether the indicator bit is valid in response to a power up of the system after a high-temperature event, a received command after a high-temperature event, a predetermined number of power ups, or a power up or received command after each of a predetermined number of high-temperature events, and write data stored in the second nonvolatile memory array to the first nonvolatile memory array when the indicator bit is valid.

19 Claims, 7 Drawing Sheets

(51) Int. Cl.
   *G11C 29/12* (2006.01)
   *G11C 14/00* (2006.01)
   *G11C 29/52* (2006.01)
   *G06F 3/06* (2006.01)

(52) U.S. Cl.
   CPC ........ *G06F 3/0679* (2013.01); *G11C 14/0036* (2013.01); *G11C 14/0045* (2013.01); *G11C 29/12* (2013.01); *G11C 29/52* (2013.01)

(56) References Cited

U.S. PATENT DOCUMENTS

| | | |
|---|---|---|
| 7,836,374 B2 | 11/2010 | Klein |
| 7,877,657 B1 | 1/2011 | Miller et al. |
| 7,894,277 B2 | 2/2011 | Lee et al. |
| 8,028,211 B1 | 9/2011 | Miller et al. |
| 8,677,216 B2 | 3/2014 | Park et al. |
| 8,724,392 B1 | 5/2014 | Asnaashari |
| 9,105,333 B1 | 8/2015 | Hu et al. |
| 2006/0039196 A1 | 2/2006 | Gorobets et al. |
| 2007/0121366 A1 | 5/2007 | Matsuno et al. |
| 2007/0271409 A1 | 11/2007 | Miura |
| 2008/0212352 A1 | 9/2008 | Oh et al. |
| 2009/0201729 A1 | 8/2009 | Song et al. |
| 2010/0153628 A1 | 6/2010 | Jang et al. |
| 2011/0099458 A1* | 4/2011 | Reche .................. G06F 11/073 714/763 |
| 2012/0271985 A1 | 10/2012 | Jeong |
| 2013/0268717 A1 | 10/2013 | Scouller et al. |
| 2013/0336047 A1 | 12/2013 | Hokenmaier |
| 2014/0089563 A1 | 3/2014 | Wu et al. |
| 2014/0101519 A1 | 4/2014 | Lee et al. |
| 2014/0229655 A1 | 8/2014 | Goss et al. |
| 2014/0281311 A1 | 9/2014 | Walker et al. |
| 2015/0049538 A1 | 2/2015 | Okubo et al. |
| 2016/0284403 A1* | 9/2016 | Navon ................ G06F 11/1068 |

FOREIGN PATENT DOCUMENTS

| | | |
|---|---|---|
| KR | 10-2010-0068923 | 6/2010 |
| WO | WO 2008/118705 A1 | 10/2008 |
| WO | WO 2011/022123 A1 | 2/2011 |

OTHER PUBLICATIONS

Extended European Search Report issued Sep. 29, 2016, in Europe Application No. 16152561.3.

Notice of Reasons for Rejection issued by the Japanese Patent Office dated Mar. 14, 2017, in counterpart Japanese Patent Application No. 2016-102269.

* cited by examiner

METHODS AND SYSTEMS FOR NONVOLATILE MEMORY DATA MANAGEMENT

This is a continuation of application Ser. No. 14/721,030, filed May 26, 2015, which is incorporated herein by reference.

TECHNICAL FIELD

The present disclosure generally relates to nonvolatile memory. More specifically, and without limitation, the example embodiments described herein relate to methods and systems for nonvolatile memory data management.

BACKGROUND

Nonvolatile semiconductor memories generally retain stored data even when not powered. Transistor-based nonvolatile memories are nonvolatile memories that store data using one or more transistors as a storage element, such as flash memory and electrically erasable programmable read-only memory (EEPROM). Transistor-based nonvolatile memories offer fast read access times and shock resistance, making them desirable in various applications. Some applications of nonvolatile memories include data storage on computing devices, mobile phones, portable audio players, and other consumer electronic products.

Emerging nonvolatile memory technologies are being developed to address various limitations associated with transistor-based nonvolatile memories. For example, most commercially available flash memories suffer from relatively low write endurance. A typical flash memory may be capable of enduring up to $1 \times 10^5$ write cycles (also referred to as program/erase cycles); whereas some emerging nonvolatile memories, such as magnetic random access memory (MRAM), may be capable of enduring up to $1 \times 10^{12}$ write cycles. As another example, flash memory arrays may suffer from scaling issues such as read disturb (sequential read cycles that cause nearby cells to change over time) and reductions in write endurance.

Emerging nonvolatile memories, however, have shortcomings. For example, high operating temperatures may cause data errors such as flipped bits in some emerging nonvolatile memories such as resistive nonvolatile memories. Such data errors may lead to system crashes, data corruption, and/or security vulnerabilities. Moreover, subjecting emerging nonvolatile memories to high manufacturing and storage temperatures may cause data retention issues such as systematic data drift, data loss, significant data corruption, and decreased data retention times.

SUMMARY

In accordance with one example embodiment, a system includes a first nonvolatile memory array, a second nonvolatile memory array, and a memory controller. The memory controller is configured to write an indicator bit to the second nonvolatile memory array, the indicator bit indicating whether data stored in the second nonvolatile memory array is valid, determine whether the indicator bit is valid in response to a power up of the system after a high-temperature event, a received command after a high-temperature event, a predetermined number of power ups, or a power up or received command after each of a predetermined number of high-temperature events, and write the data stored in the second nonvolatile memory array to the first nonvolatile memory array when the indicator bit is valid.

In accordance with another example embodiment, a method for managing data in a system includes writing an indicator bit to a second nonvolatile memory array, the indicator bit indicating whether data of the second nonvolatile memory array is valid, determining whether the indicator bit is valid in response to a power up of the system after a high-temperature event, a received command after a high-temperature event, a predetermined number of power ups, or a power up or received command after each of a predetermined number of high-temperature events, and writing the data written to the second nonvolatile memory array to a first nonvolatile memory array when the indicator bit is determined to be valid.

Before explaining certain embodiments of the present disclosure in detail, it is to be understood that the disclosure is not limited in its application to the details of construction and to the arrangements of the components set forth in the following description or illustrated in the drawings. The disclosure is capable of embodiments in addition to those described and of being practiced and carried out in various ways. Also, it is to be understood that the phraseology and terminology employed herein, as well as in the abstract, are for the purpose of description and should not be regarded as limiting.

As such, those skilled in the art will appreciate that the conception and features upon which this disclosure is based may readily be utilized as a basis for designing other structures, methods, and systems for carrying out the several purposes of the present disclosure. Furthermore, the claims should be regarded as including such equivalent constructions insofar as they do not depart from the spirit and scope of the present disclosure.

BRIEF DESCRIPTION OF THE DRAWINGS

The accompanying drawings, which are incorporated in and constitute part of this specification, and together with the description, illustrate and serve to explain the principles of various exemplary embodiments.

DETAILED DESCRIPTION OF EXAMPLE EMBODIMENTS

Figure 1:
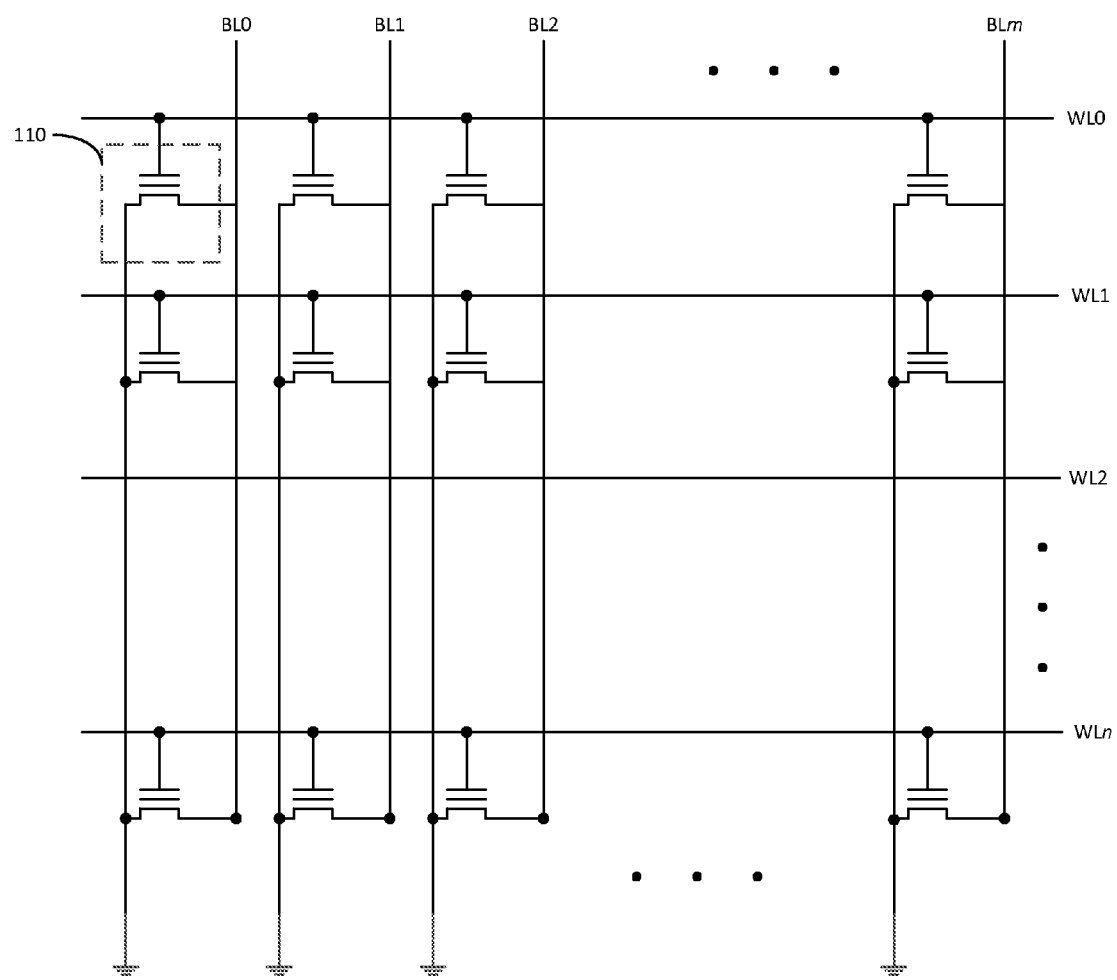
FIG. 1 is a circuit diagram of an example transistor-based nonvolatile memory array.

Embodiments of the present disclosure provide improved methods and systems for data management in memory systems that include emerging nonvolatile memories. Many emerging nonvolatile memories have significant advantages over transistor-based nonvolatile memories in terms of write speed and endurance, power consumption, data retention, data security, and byte-level random access. However, some emerging nonvolatile memories, such as resistive nonvolatile memories, may be susceptible to data retention and corruption issues due to high temperatures and/or electromagnetic interference (EMI). Resistive nonvolatile memories may include, for example, any nonvolatile memory that uses different resistance states to store data. Examples of resistive nonvolatile memories include phase-change random access memory (PCRAM), magnetic random access memory (MRAM), programmable metallization cell (PMC) memory such as conductive-bridging random access memory (CBRAM), and resistive random access memory (RRAM).

PCRAM stores data by using differences in resistance between amorphous and crystalline phases of chalcogenide-based material. The amorphous phase corresponds to a high-resistance phase and the crystalline phase corresponds to a low-resistance phase. MRAM stores data by using a tunnel barrier layer between two ferromagnetic layers to switch between different resistance states. A low-resistance state is achieved when the magnetization directions of the two ferromagnetic layers are parallel. A high-resistance state is achieved when the magnetization directions of the two ferromagnetic layers are antiparallel. CBRAM cells include a thin film of electrolyte between two solid metal electrodes. A CBRAM cell stores data at different resistance states by forming a nanowire between the metal electrodes in the electrolyte film. The absence of the nanowire corresponds to a high-resistance state and the presence of the nanowire corresponds to a low-resistance state. RRAM stores data as two or more resistance states based on resistive switching in transition metal oxides. Similar to CBRAM cells, a RRAM cell includes a metal-insulator-metal structure. Different logic states are represented by producing a trail of conducting defects (referred to as a "filament") in the insulator layer. The absence of the filament corresponds to a high-resistance state and the presence of the filament corresponds to a low-resistance state. Respective high and low resistance states of the various resistive memories serve to store data representing first and second logical values, e.g., "0" and "1".

Nonvolatile memories may be rated to operate within various temperature ranges. For example, a nonvolatile memory may be rated to operate within ambient temperatures of 0 to 85° C. (commercial rated), −40 to 125° C. (industrial/automotive rated), or −55 to 125° C. (military rated). Storage temperature ratings typically range up to 150° C. Nonvolatile memories may also experience high temperatures during IC board mount. For example, a typical wave solder process may reach temperatures up to 250° C. Resistive nonvolatile memories may experience degraded performance near the upper portions of these ranges. For example, data errors such as bit flipping may occur in resistive nonvolatile memory cells at high ambient operating temperatures. Moreover, data written to a resistive nonvolatile memory before exposure to a high-temperature, such as caused by a wave soldering process, may experience significant data errors such as systematic data drift and decreased data retention times.

Embodiments of the present disclosure provide improvements in mitigating the effects that high-temperatures have on resistive nonvolatile memories, thereby enabling performance improvements in systems and/or integrated circuits (ICs) including such memories. Embodiments of the present disclosure provide a memory system configured to transfer data between a resistive nonvolatile memory and a transistor-based nonvolatile memory before and/or after a high-temperature event. Data stored in the resistive nonvolatile memory is written to the transistor-based nonvolatile memory before the high-temperature event and written back to the resistive nonvolatile memory after the high-temperature event. Accordingly, the transistor-based nonvolatile memory is used as backup storage, and any data lost or corrupted in the resistive nonvolatile memory due to the high-temperature event is recovered from the transistor-based nonvolatile memory.

Reference will now be made in detail to the exemplary embodiments implemented according to the disclosure, the examples of which are illustrated in the accompanying drawings. Wherever possible, the same reference numbers will be used throughout the drawings to refer to the same or like parts.

FIG. 1 illustrates a circuit diagram of an example transistor-based nonvolatile memory array 100. Transistor-based nonvolatile memory array 100 includes a plurality of transistor-based nonvolatile memory cells 110. Each transistor-based nonvolatile memory cell 110 is associated with a word line (e.g., WL0 through WLn) and a bit line (e.g., BL0 through BLm). Transistor-based nonvolatile memory array 100 may be formed by nonvolatile memories that store data using one or more transistors as a storage element. Transistor-based nonvolatile memories include programmable read-only memory (PROM), electrically programmable read-only memory (EPROM), EEPROM memory, flash memory, or eFUSE memory. Moreover, transistor-based nonvolatile memory array 100 may comprise a two-dimensional memory array or a three-dimensional memory array.

As shown in FIG. 1, when transistor-based nonvolatile memory array 100 is implemented using EPROM, EEPROM, or flash memory, each transistor-based nonvolatile memory cell 110 includes a floating-gate metal-oxide semiconductor field-effect transistor (MOSFET). The floating-gate MOSFET (FGMOS) can store charge in an electrically isolated floating gate. The electrical isolation allows the floating gate to retain a charge for extended periods of time without power. A fully charged floating gate may represent a logical "0" state and an uncharged floating gate may represent a logical "1" state, or vice-versa.

Figure 2:
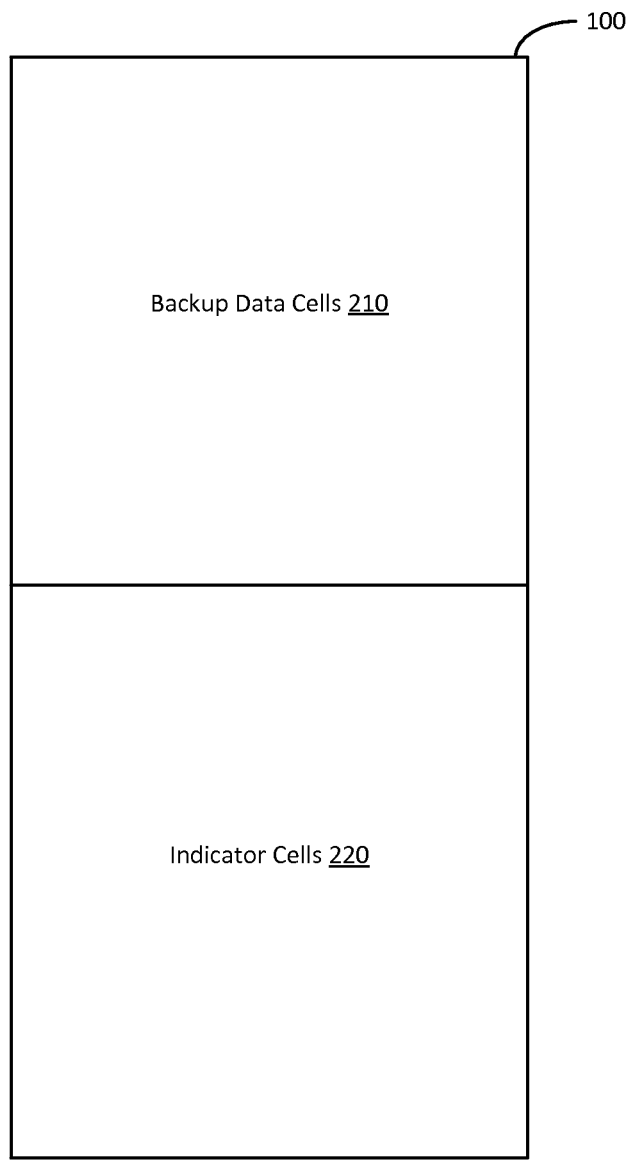
FIG. 2 is a block diagram of an example transistor-based nonvolatile memory array for implementing embodiments consistent with the present disclosure.

FIG. 2 illustrates a block diagram of transistor-based nonvolatile memory array 100 for implementing embodiments consistent with the present disclosure. As shown in FIG. 2, transistor-based nonvolatile memory array 100 includes a plurality of cell types. For example, backup data cells 210 are configured to store backup data bits. Each backup data cell 210 stores one backup data bit. The backup data bits may be written and accessed in various storage units, such as pages, blocks, sectors, words, or any other storage configuration known in the art. Each storage unit may comprise any number of backup data bits.

In some embodiments, transistor-based nonvolatile memory array 100 also includes indicator cells 220. Indicator cells 220 are configured to store indicator bits for indicating whether backup data is successfully written to backup data cells 210. Each indicator cell 220 stores one indicator bit. Various configurations of indicator bits may be used to indicate whether backup data is successfully written to backup data cells 210. For example, one indicator bit may be used to indicate whether all the backup data is successfully written to backup data cells 210. As another example, one indicator bit may be used to indicate whether each storage unit of backup data is successfully written to backup data cells 210. According to the example, if three pages of backup data are written to backup data cells 210, indicator cells 220 may store three indicator bits as one indicator bit per indicator cell 220.

Figure 3:
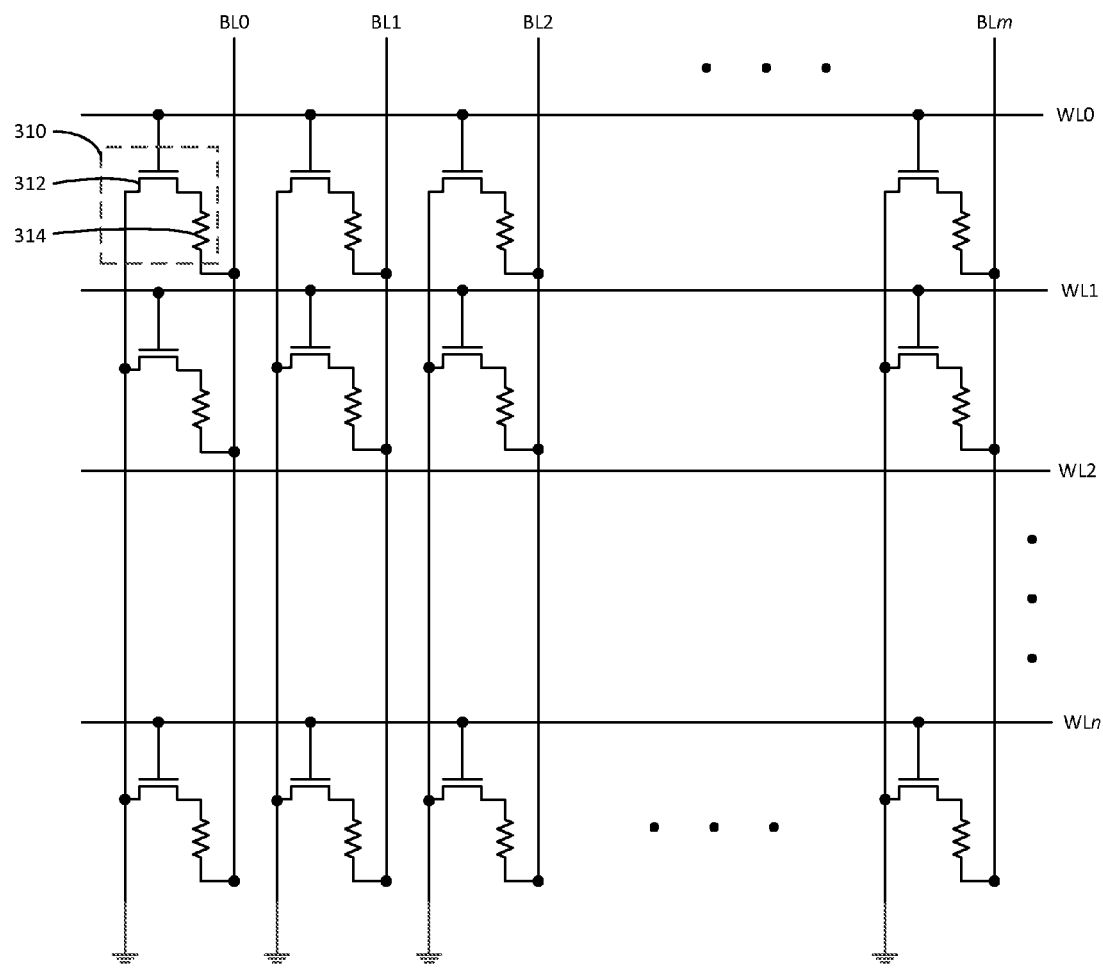
FIG. 3 is a circuit diagram of an example resistive nonvolatile memory array for implementing embodiments consistent with the present disclosure.

FIG. 3 illustrates a circuit diagram of an example resistive nonvolatile memory array 300 for implementing embodiments consistent with the present disclosure. Resistive nonvolatile memory array 300 may be formed using any of the resistive nonvolatile memories described above, such as PCRAM, RRAM, MRAM, or CBRAM. Moreover, resistive nonvolatile memory array 300 may comprise a two-dimensional memory array or a three-dimensional memory array.

As shown in FIG. 3, resistive nonvolatile memory array 300 includes a plurality word lines (WL0 through WLn), bit lines (BL0 through BLm), and resistive nonvolatile memory cells 310. Each resistive nonvolatile memory cell 310 is associated with a word line and a bit line. Each resistive nonvolatile memory cell 310 includes a selecting element 312 and a resistive storage element 314. Resistive nonvolatile memory cells 310 may be implemented by any of the resistive nonvolatile memories described above, such as a PCRAM cell, RRAM cell, MRAM cell, or conductive-bridging RAM cell. Selecting element 312 behaves as a selecting switch to control access to the resistive nonvolatile memory cell 310. Selecting element 312 may be implemented by, for example, a diode, a metal-oxide semiconductor field-effect transistor (MOSFET), or a bipolar junction transistor (BJT). In some embodiments, selecting element 312 may be optional, for example where resistive nonvolatile memory cell 310 is implemented by a RRAM cell.

Figure 4:
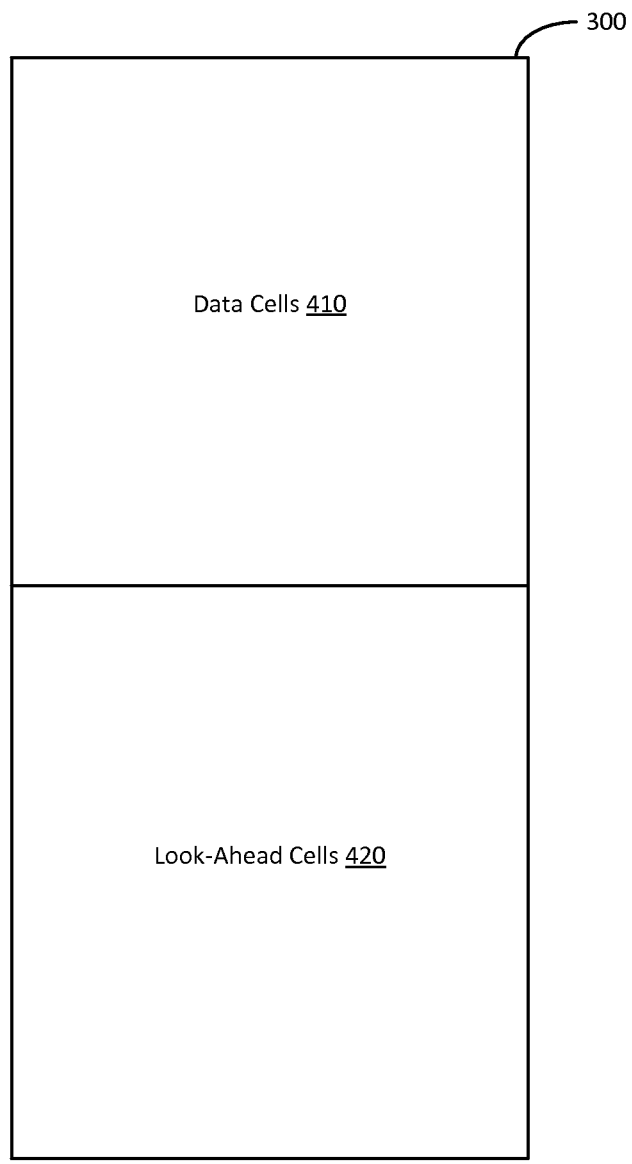
FIG. 4 is a block diagram of an example resistive nonvolatile memory array for implementing embodiments consistent with the present disclosure.

FIG. 4 illustrates a block diagram of resistive nonvolatile memory array 300 for implementing embodiments consistent with the present disclosure. As shown in FIG. 4, resistive nonvolatile memory array 300 includes a plurality of cell types. For example, data cells 410 are configured to store data bits. Each data cell 410 stores one data bit. The data bits may be written and accessed in various storage units, such as pages, blocks, sectors, words, or any other storage configuration known in the art. Each storage unit may comprise any number of data bits.

In some embodiments, resistive nonvolatile memory array 300 also includes look-ahead cells 420. Look-ahead cells 420 are configured to store look-ahead bits for detecting substantial data corruption or systematic data drift of the data bits stored in data cells 410. Each look-ahead cell 420 is configured to store one look-ahead bit. The look-ahead bits stored in look-ahead cells 420 serve as indicators of data corruption or systematic drift due to, for example, EMI or high-temperature events such as an environmental stress screening thermal cycle, a wave soldering process, a reflow soldering process, a highly accelerated life test, or high temperature storage of the resistive nonvolatile memory array 300. The number of look-ahead cells 420 included in resistive nonvolatile memory array 300 depends on a number of factors such as the total number of memory cells included in resistive nonvolatile memory array 300, the importance of memory system reliability, the amount of memory system throughput allocable to systematic drift detection, etc. Examples of the total number of bits stored in look-ahead cells 420 include 16 bits or 32 bits. The total number of look-ahead bits stored in look-ahead cells 420 may be small compared to the number of data bits stored in data cells 410. Accordingly, using a small number of look-ahead bits as a proxy for the quality of a large number of data bits improves memory system efficiency and reduces the amount of memory system resources needed for error detection.

In some embodiments, data cells 410 and/or look-ahead cells 420 are configured to store multiple bits per cell. For example, multi-level cells may be used in resistive memory array 300. Multi-level cells use three or more different resistance states to store two or more data bits. For example, a multi-level cell with four different resistance states can store two bits, each bit using two resistance states to represent a logical "0" and "1". However, increasing the number of bits stored per cell may result in a greater bit error rate and thus require the use of error correction codes to detect and correct those errors.

Figure 5:
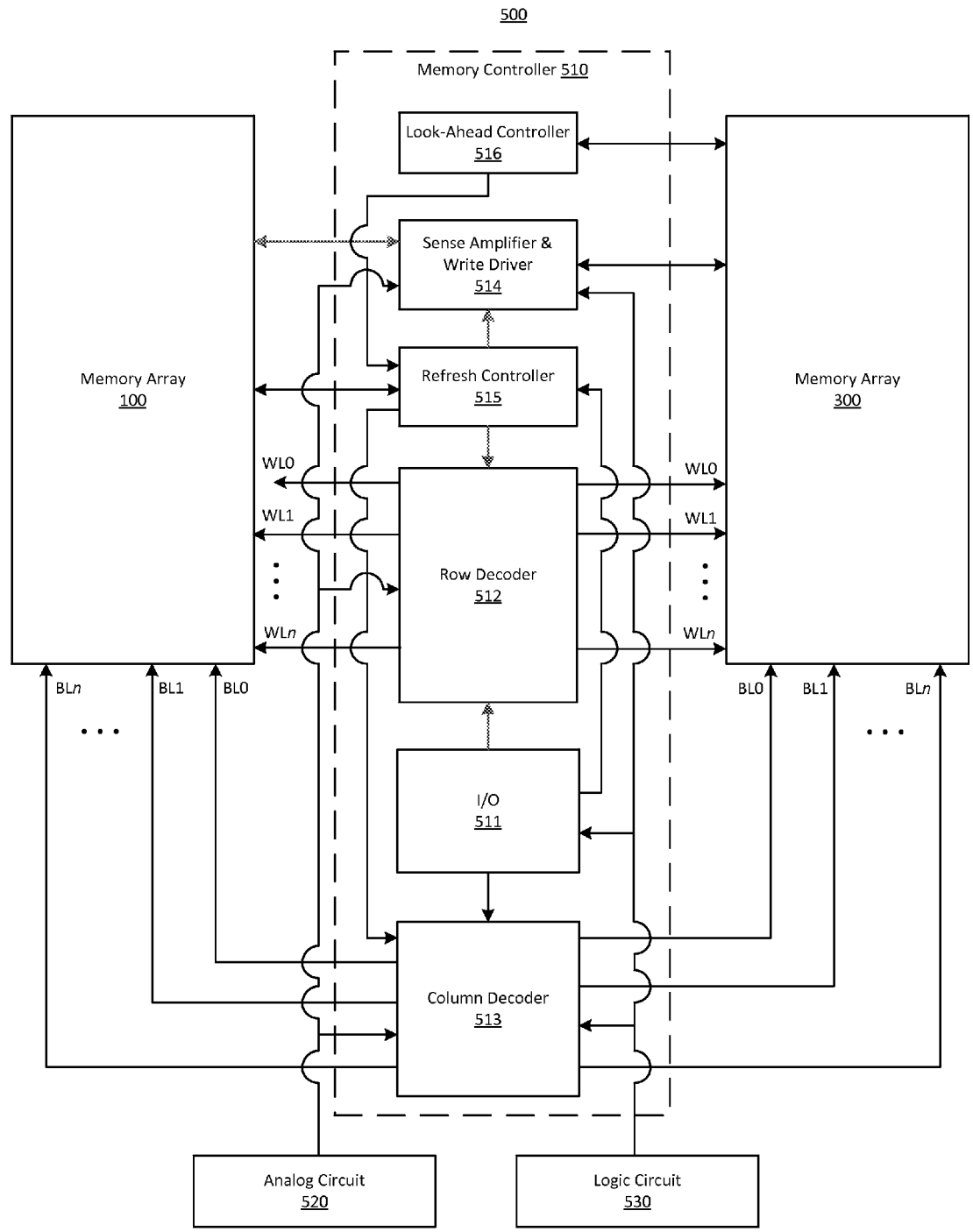
FIG. 5 is a block diagram of an example memory system for implementing embodiments consistent with the present disclosure.

FIG. 5 illustrates a block diagram of an example memory system 500 for implementing embodiments consistent with the present disclosure. As shown in FIG. 5, memory system 500 includes transistor-based nonvolatile memory array 100, resistive nonvolatile memory array 300 a memory controller 510, an analog circuit 520, and a logic circuit 530. It will be appreciated from the present disclosure that the number and arrangement of these components is exemplary only and provided for purposes of illustration. Other arrangements and numbers of components may be utilized without departing from the teachings and embodiments of the present disclosure. As an example, transistor-based nonvolatile memory array 100, resistive nonvolatile memory array 300, memory controller 510, analog circuit 520, and logic circuit 530 may be formed on the same semiconductor die, on separate semiconductor dies that are included the same IC package, on separate semiconductor dies included in separate IC packages, or any configuration known in the art. As another example, memory controller 510 may control multiple resistive nonvolatile memory arrays 300 and/or multiple transistor-based nonvolatile memory arrays 100. As a further example, separate memory controllers 510 may control transistor-based nonvolatile memory array 100 and resistive nonvolatile memory array 300.

In some embodiments, memory controller 510 includes an input/output interface (I/O) 511, a row decoder (also referred to as a word line decoder) 512, a column decoder 513, a sense amplifier and write driver 514, a refresh controller 515, and a look-ahead controller 516. Components 511-516 included in memory controller 510 may be implemented by combinations of hardware and software. For example, components 511-516 may be implemented by a microprocessor, an application specific integrated circuit (ASIC), a programmable gate array (PGA) or field-programmable gate array (FPGA), electrical circuits, a complex programmable logic devices (CPLD) or a custom logic circuit, or any combination thereof. Moreover, some or all of the functions of components 511-516 may be performed by the same hardware/software combination. For example, the functions of refresh controller 515 and look-ahead controller 516 may be performed by the same microprocessor, ASIC, PGA, FPGA, CPLD or custom logic circuit, and all the controllers may or may not share the same write algorithm.

I/O 511 receives input signals from external sources and converts the input signals so they may be understood and accepted by the components included in memory controller 510. For example, I/O 511 may receive memory cell addresses, data, commands such as read commands and write commands, etc.

In a read operation, I/O 511 transmits row and column coordinates to row decoder 512 and column decoder 513, respectively. Row decoder 512 decodes the row coordinates and provides a sense voltage to a corresponding word line in transistor-based nonvolatile memory array 100 or resistive nonvolatile memory array 300. When reading from transistor-based nonvolatile memory array 100, the sense voltage activates the FGMOS control gate of each transistor-based nonvolatile memory cell 110 connected to the word line. When reading from resistive nonvolatile memory array 300, the sense voltage activates the selection element 312 of each resistive nonvolatile memory cell 310 connected to the word line.

Column decoder 513 decodes the column coordinates and connects a corresponding bit line to sense amplifier and write driver 514. Sense amplifier and write driver 514 includes a read circuit and a write circuit. When reading from transistor-based nonvolatile memory array 100, the read circuit measures the current through the FGMOS drain-source path of the transistor-based nonvolatile memory cell 110 at the appropriate word line/bit line intersection. When reading from resistive nonvolatile memory array 300, the read circuit measures the current through the resistive storage element 314 of the resistive nonvolatile memory cell 310 at the appropriate word line/bit line intersection.

Sense amplifier and write driver 514 amplifies the measured current and provides the output to I/O 511. I/O 511 transmits the output to an external destination or holds the output until requested by an external source.

In some embodiments, a plurality of transistor-based nonvolatile memory cells 110 or resistive nonvolatile memory cells 310 associated with the same activated word line may be read in a single read operation. When row decoder 512 provides the sense voltage to the corresponding word line, each transistor-based nonvolatile memory cell 110 or resistive nonvolatile memory cell 310 on the word line is activated. Then, the read circuit measures current through each activated transistor-based nonvolatile memory cell 110 or resistive nonvolatile memory cell 310 on the bit lines associated with those cells.

In one embodiment of a write operation, I/O 511 receives data from an external source and a transistor-based nonvolatile memory cell 110 address or resistive nonvolatile memory cell 310 address where the data is to be stored. I/O 511 converts the address to row and column coordinates and sends the coordinates to row decoder 512 and column decoder 513, respectively. Row decoder 512 decodes the row coordinates and provides a write voltage to a corresponding word line. Column decoder 513 decodes the column coordinates and connects a corresponding bit line to sense amplifier and write driver 514. I/O 511 transmits instructions to sense amplifier and write driver 514 to write either a "0" or a "1" to the transistor-based nonvolatile memory cell 110 or resistive nonvolatile memory cell 310 located at the intersection of the activated word line and bit line. When writing to one of the transistor-based nonvolatile memory cells 110, the write circuit of sense amplifier and write driver 514 drains or accumulates charge on the FGMOS floating gate depending on whether a "1" or "0" is to be stored. When writing to one of the resistive nonvolatile memory cells 310, the write circuit of sense amplifier and write driver 514 changes the resistance of resistive element 312 to a high-resistance state or low-resistance depending on whether a "1" or "0" is to be stored. In another embodiment of a write operation, I/O 511 receives data from an external source and transistor-based nonvolatile memory cell 110 and resistive nonvolatile memory cell 310 addresses where the data is to be stored. Accordingly, sense amplifier and write driver 514 writes the received data simultaneously to transistor-based nonvolatile memory array 100 and resistive nonvolatile memory array 300.

In still another embodiment of a write operation, sense amplifier and write driver 514 writes data stored in transistor-based nonvolatile memory array 100 to resistive nonvolatile memory array 300, and/or vice-versa. In the embodiment, memory controller 510 includes a refresh controller 515. Refresh controller 515 backs up data stored in resistive nonvolatile memory array 300 by reading the data and writing it to transistor-based nonvolatile memory array 100. To back up the data stored in resistive nonvolatile memory array 300, refresh controller 515 sends row and column coordinates to row decoder 512 and column decoder 513, respectively. Row decoder 512 and column decoder 513 decode the coordinates and read circuit of sense amplifier and write driver 514 reads the data stored in the corresponding data cells 410 of resistive nonvolatile memory array 300. Refresh controller 515 sends backup data cell 210 addresses to sense amplifier and write driver 514. The write circuit of sense amplifier and write driver 514 writes the data read from resistive nonvolatile memory array 300 to the corresponding backup data cells 210 of transistor-based nonvolatile memory array 100.

Refresh controller 515 further sends indicator cell 220 addresses and indicator bits to sense amplifier and write driver 514. The write circuit of sense amplifier and write driver 514 writes the indicator bits to the corresponding indicator cells 220 of transistor-based nonvolatile memory array 100. The indicator bits indicate whether the backup data is successfully written to transistor-based nonvolatile memory array 100. An indicator bit having a logic value of "0" may indicate that backup data is successfully written to transistor-based nonvolatile memory array 100, and an indicator bit having a logic value of "1" may indicate that backup data is not successfully written to transistor-based nonvolatile memory array 100, or vice-versa. Various configurations of indicator bits may be used to indicate whether backup data is successfully written to transistor-based nonvolatile memory array 100. For example, one indicator bit may be used to indicate whether all the backup data is successfully written to transistor-based nonvolatile memory array 100. As another example, one indicator bit may be used for each storage unit to indicate whether that storage unit of backup data is successfully written to transistor-based nonvolatile memory array 100.

An unsuccessful write operation may occur when backup data cannot be written to transistor-based nonvolatile memory array 100 because one or more backup data cells 210 cannot be altered. Examples of backup data cells 210 that cannot be altered include backup data cells 210 that are write-protected or worn out. Memory cell wear-out is caused by break down of oxide layers insulating the FGMOS floating gate in transistor-based nonvolatile memory cells 110 due to repeated write cycle operations. As the oxide layers deteriorate, the floating gate's ability to hold a charge for an extended period of time decreases until the FGMOS can no longer represent logic states using different levels of electrical charge. An unsuccessful write operation may also occur where backup data cannot be written to transistor-based nonvolatile memory array 100 because one or more backup data cell 210 addresses provided by refresh controller 515 are invalid addresses.

In some embodiments, sense amplifier and write driver 514 provides a notification to refresh controller 515 of whether the backup data was successfully written to transistor-based nonvolatile memory array 100. If the backup data was successfully written to transistor-based nonvolatile memory array 100, refresh controller 515 provides one or more indicator bits to sense amplifier and write driver 514 that indicate the backup data was successfully written and therefore can be used to refresh data stored in resistive nonvolatile memory array 300. If the backup data was not successfully written to transistor-based nonvolatile memory array 100, refresh controller 515 provides one or more indicator bits to sense amplifier and write driver 514 that indicate the backup data was not successfully written and therefore cannot be used to refresh data stored in resistive nonvolatile memory array 300.

Alternatively, or in addition, refresh controller 515 rewrites the unsuccessfully written backup data to transistor-based nonvolatile memory array 100. As an example, if one indicator bit is used to indicate whether all the backup data is successfully written to transistor-based nonvolatile memory array 100, and the indicator bit indicates the backup data was not successfully written to transistor-based nonvolatile memory array 100, refresh controller 515 rewrites the entire data stored in resistive nonvolatile memory array 300 to transistor-based nonvolatile memory array 100. As another example, if one indicator bit is used to indicate whether each storage unit of backup data is successfully written to transistor-based nonvolatile memory array 100, refresh controller 515 rewrites only the data in storage units having an indicator bit that indicates an unsuccessful writing of that storage unit of data.

Refresh controller 515 refreshes the data stored in resistive nonvolatile memory array 300 by reading backup data stored in transistor-based nonvolatile memory array 100 and writing it to resistive nonvolatile memory array 300. To refresh the data stored in resistive nonvolatile memory array 300, the refresh controller 515 sends row and column coordinates to row decoder 512 and column decoder 513, respectively. Row decoder 512 and column decoder 513 decode the coordinates and read circuit of sense amplifier and write driver 514 reads the data stored in the corresponding backup data cells 210 of transistor-based nonvolatile memory array 100. Refresh controller 515 sends data cell 410 addresses to sense amplifier and write driver 514. The write circuit of sense amplifier and write driver 514 writes the data read from transistor-based nonvolatile memory array 100 to the corresponding data cells 410 of resistive nonvolatile memory cells 310.

In some embodiments, refresh controller 515 reads the indicator bit(s) stored in the indicator cells 220 of transistor-based nonvolatile memory array 100 before refreshing the data stored in resistive nonvolatile memory array 300. Refresh controller 515 reads the indicator bit(s) and determines whether the indicator bit(s) are still valid. Indicator bit(s) become invalid when they flip logic states (e.g., from a logic "0" to a logic "1" or vice-versa) or become corrupted. Flipped logic states or corruption occurs due to, for example, exposure of the indicator cells 220 to high-temperatures or EMI. Refresh controller 515 determines whether the indicator bit(s) flip logic states or become corrupted using error detection techniques such as cyclic redundancy checks (CRCs), repetition codes, parity bits, checksums, or error correcting codes.

The validity of the indicator bit(s) stored in indicator cells 220 serves as a proxy for the quality of backup data stored in transistor-based nonvolatile memory array 100. Valid indicator bit(s) indicate that the quality of the backup data stored in transistor-based nonvolatile memory array 100 likely has not degraded. Conversely, invalid indicator bit(s) indicate that the quality of the backup data stored in transistor-based nonvolatile memory array 100 likely has degraded and should not be used to refresh the data stored in resistive nonvolatile memory array 300. Accordingly, if refresh controller 515 reads the indicator bit(s) and determines that one or more indicator bits have become invalid (i.e., flipped states or become corrupted), refresh controller 515 does not use the backup data stored in transistor-based nonvolatile memory array 100 to refresh the data stored in resistive nonvolatile memory array 300. The total number of indicator bits stored in indicator cells 220 may be small compared to the number of backup data bits stored in backup data cells 210. Accordingly, using a small number of indicator bits as a proxy for the quality of a large number of backup data bits improves memory system efficiency and reduces the amount of memory system resources needed for error detection.

In some embodiments, memory controller 510 includes a look-ahead controller 516. Look-ahead controller 516 detects significant data corruption and/or systematic data drift of data stored in data cells 410. For example, look-ahead controller 516 reads look-ahead bits stored in look-ahead cells 420 and determines the number of defective look-ahead bits stored in look-ahead cells 420. Look-ahead controller 516 determines which look-ahead bits are defective using error correction codes such as, for example, Hamming codes, Bose, Chaudhuri, and Hocquenghem (BCH) codes, parity bits, Reed-Solomon codes, Turbo codes, low-density parity-check codes (LDPC), convolutional codes, or any other error correction codes known in the art. If the number of defective look-ahead bits equals or exceeds a threshold number of defective look-ahead bits, look-ahead controller 516 initiates a refresh of the data stored in data cells 410. An example threshold number of defective look-ahead bits may be 50% of the look-ahead bits stored in look-ahead cells 420. Thus, in the present example, when there are 32 look-ahead bits stored in look-ahead cells 420, look-ahead controller 516 initiates a refresh when look-ahead controller 516 determines that the number of defective look-ahead bits is equal to or greater than 16 bits.

Look-ahead controller 516 initiates data refresh by transmitting a refresh command to refresh controller 515. Refresh controller 515 performs a refresh of the data stored in data cells 410 according to the various refresh operations described above.

Analog circuit 520 communicates with components of memory controller 510 such as, for example, row decoder 512, column decoder 513, and sense amplifier & write driver 514. Analog circuit 520 may include various types of analog circuit elements such as dividers, comparators, current mirrors, filters, amplifiers, current/voltage sources or references, current limiters, voltage regulators, charge pumps, and other analog circuits known in the art. Analog circuit 520 performs various functions such as, for example, generating high-voltage pulses for programming and erasing memory cells 110 and 310, generating memory cell read currents, performing built-in self-test of memory system 500, generating reference currents, comparing reference currents with memory cell read currents to determine logic states of memory cells 110 and 310, etc.

Logic circuit 530 communicates with components of memory controller 510 such as, for example, I/O 511, column decoder 513, and sense amplifier and write driver 514. Logic circuit 530 may include various types of digital circuit elements such as adders, subtractors, multiplexors, demultiplexors, encoders, decoders, and other digital logic circuits known in the art. Logic circuit 530 performs various functions such as, for example, controlling memory read and write logic, performing built-in self-test of memory system 500, decoding commands and instructions received from test technicians/engineers or other systems in communication with memory system 500, multiplexing and demultiplexing memory cell 110 and 310 addresses, etc.

Figure 6:
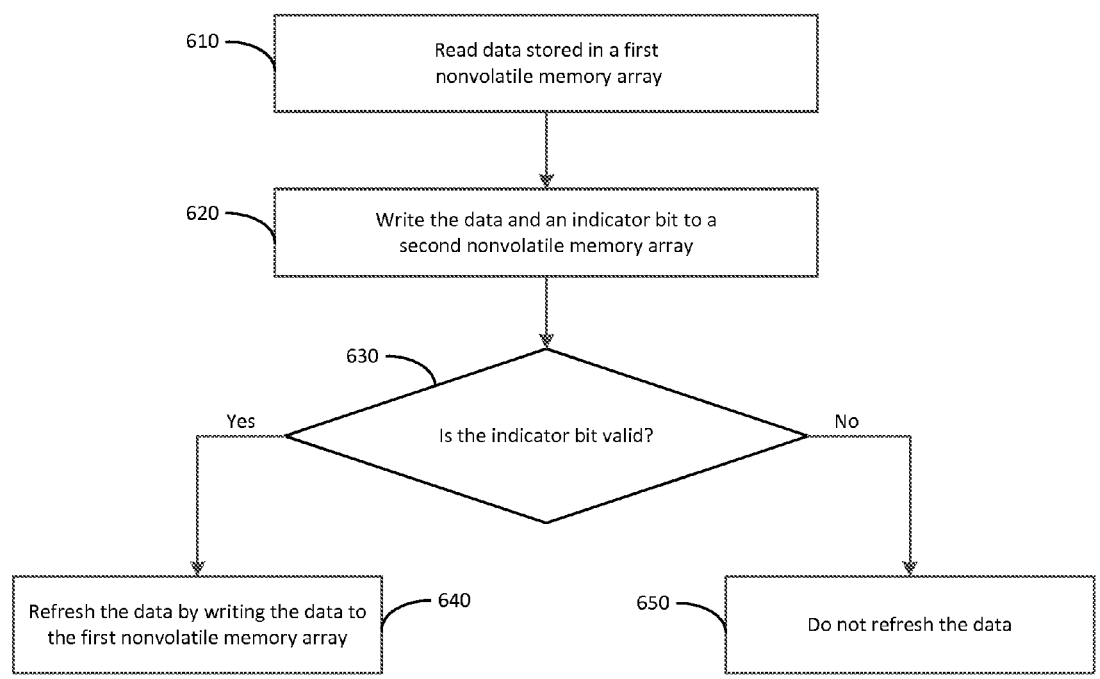
FIG. 6 is a flow diagram depicting example steps of a method for managing data in a memory system.

FIG. 6 depicts a flowchart of an example method 600, consistent with some embodiments and aspects of the present disclosure. Method 600 may be implemented, for example, for managing data in a memory system. In some embodiments, method 600 may be implemented by a memory system such as, for example, memory system 500 illustrated in FIG. 5.

In some embodiments, example method 600 includes reading data stored in a first nonvolatile memory array (610). The first nonvolatile memory array may be a resistive nonvolatile memory array (e.g., resistive memory array 300 of FIGS. 3-5) formed by any of the resistive nonvolatile memories described above. A memory controller (e.g., memory controller 510 of FIG. 5) included in the memory system reads data stored in data cells (e.g., data cells 410 of FIG. 4) of the first nonvolatile memory array. The memory controller reads data in various storage units such as pages, blocks, sectors, words, or any other storage unit known in the art. Each storage unit may comprise any number of data bits.

In some embodiments, the memory controller includes a refresh controller (e.g., refresh controller 515 of FIG. 5) that reads the data stored in the first nonvolatile memory array. For example, the refresh controller reads the data stored in the first nonvolatile memory array in response to a received command, in response to a power up of the memory system, in response to a predetermined number of power ups, or in response to a predetermined number of received commands. Moreover, the refresh controller may read the data stored in the first resistive nonvolatile memory array before a high-temperature event.

In some embodiments, example method 600 includes writing the data read from the first nonvolatile memory array (610) and an indicator bit to a second nonvolatile memory array (620). The second nonvolatile memory array may be a transistor-based nonvolatile memory array (e.g., transistor-based nonvolatile memory array 100 of FIGS. 1, 2, and 5) formed by any of the transistor-based nonvolatile memories described above. The memory controller or the refresh controller writes the data to the second nonvolatile memory array by sending backup data cell addresses (e.g., backup data cell 210 of FIG. 2) to a sense amplifier and write driver (e.g., sense amplifier and write driver 514 of FIG. 5) included in the memory controller. A write circuit of sense amplifier and write driver writes the data read from the data cells of first nonvolatile memory array to the corresponding backup data cells of the second nonvolatile memory array. Accordingly, the data written to the second nonvolatile memory array becomes backup data for the data stored in the first nonvolatile memory array.

The memory controller or refresh controller may write the indicator bit to an indicator cell (e.g., indicator cell 220 of FIG. 2) included in the second nonvolatile memory array. The indicator bit indicates whether the backup data is successfully written to the backup data cells of the second nonvolatile memory array. In some embodiments, the memory controller or refresh controller writes a plurality of indicator bits to the indicator cells included in the second nonvolatile memory array. Each indicator bit indicates whether each storage unit of backup data is successfully written to the second nonvolatile memory array.

The memory controller or refresh controller determines whether the indicator bit written to the second nonvolatile memory array is valid (630) and does so during various stages of memory system operation. For example, the memory controller or refresh controller determines whether the indicator bit is valid in response to power up of the memory system after a high-temperature event, a received command after a high-temperature event, after a predetermined number of power ups, in response to a received command after a predetermined number of temperature events, or in response to a power up after a predetermined number of temperature events. In some embodiments, the memory controller or refresh controller determines whether the indicator bit is valid in response to a power up or received command after each of a predetermined number of high-temperature events. Thus, the memory controller or refresh controller determines whether the indicator bit is valid in response to each power up of the memory system after each of three high-temperature events, for example, and then stops determining whether the indicator bit is valid in response to subsequent power ups. Accordingly, when the number of high-temperature events that the memory system will be subjected to is known, such as in a production or manufacturing test setting, the memory controller or refresh controller can be configured to determine whether the indicator bit is valid until the memory system is shipped from the production/manufacturing facility by limiting the determining to power ups after the known number of high-temperature events. The high-temperature event includes at least one of an environmental stress screening thermal cycle, a wave soldering process, a reflow soldering process, a highly accelerated life test, high-temperature storage of the memory system, or any other high-temperature event known in the art. In some embodiments, when the memory controller or refresh controller writes a plurality of indicator bits to the indicator cells, the memory controller or refresh controller determines whether the indicator bit associated each storage unit of data is valid.

When it is determined that the indicator bit is valid (630-yes), example method 600 includes refreshing the data stored in the resistive memory array (640). Refreshing the data stored in the resistive nonvolatile memory array includes replacing the stored data with the backup data written to the second nonvolatile memory array (620). The memory controller reads the backup data stored in the second nonvolatile memory array as part of the refresh process using one of the example write operations described above. The memory controller writes the backup data to the first nonvolatile memory array using one of the example write operations described above. The memory controller or refresh controller refreshes the data at various stages of memory system operation. For example, the memory controller or refresh controller may refresh the data immediately after determining that the indicator bit is valid (630-yes). As another example, the memory controller may refresh the data in response to a subsequent power up of the memory system (e.g., the next power up) or during a subsequent idle mode of the memory system (e.g., the next idle mode).

In some embodiments, where the memory controller or refresh controller writes one indicator bit for all the backup data written to the second nonvolatile memory array, the memory controller or refresh controller refreshes the data stored in the first nonvolatile memory array by writing all the backup data to the first nonvolatile memory. In other embodiments, where the memory controller or refresh controller writes a plurality of indicator bits to the indicator cells included in the second nonvolatile memory array, the memory controller or refresh controller refreshes the data stored in the first nonvolatile memory array by writing only the storage units of backup data having a valid indicator bit.

When it is determined that the indicator bit is invalid (630-no), the memory controller or refresh controller does not refresh the data stored in the first nonvolatile memory array. The indicator bit becomes invalid when it flips logic state or becomes corrupted due to, for example, the high-temperature event. An invalid indicator bit may indicate that the quality of backup data stored in the second nonvolatile memory array has degraded and should not be used to refresh the data stored in the first nonvolatile memory array. Accordingly, when the memory controller or refresh controller writes one indicator bit for all the backup data written to the second nonvolatile memory array and determines the indicator bit has become invalid (630-no), the memory controller or refresh controller does not write any of the backup data stored in the second nonvolatile memory array to the data cells of the first nonvolatile memory array. When the memory controller or refresh controller writes a plurality of indicator bits to the indicator cells included in the second nonvolatile memory array, the memory controller or refresh controller does not write the storage units of backup data having an invalid indicator bit.

Figure 7:
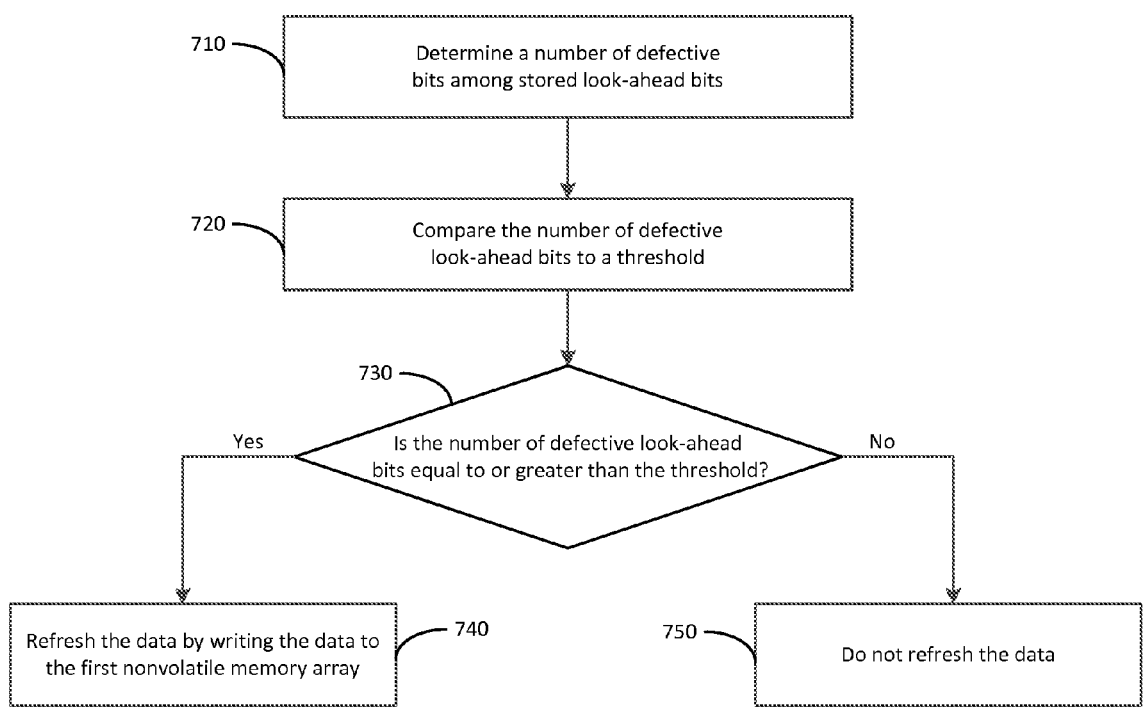
FIG. 7 is a flow diagram depicting example steps of another method for managing data in a memory system.

FIG. 7 depicts a flowchart of an example method 700, consistent with some embodiments and aspects of the present disclosure. Method 700 may be implemented, for example, for managing data in a memory system. In some embodiments, method 700 may be implemented by a memory system such as, for example, memory system 500 illustrated in FIG. 5. Moreover, in some embodiments, portions of method 600 and 700 may be performed separately, together, or some combination thereof.

In some embodiments, example method 700 includes determining a number of defective bits among look-ahead bits stored in the first nonvolatile memory array (710). A memory controller (e.g., memory controller 510 of FIG. 5) included in the memory system reads look-ahead bits stored in look-ahead cells (e.g., look-ahead cells 420 of FIG. 4) of a first nonvolatile memory array (e.g., resistive nonvolatile memory array 300 of FIGS. 3-5). The memory controller reads the look-ahead bits in various storage units such as pages, blocks, sectors, words, or any other storage unit known in the art. Each storage unit may include any number of look-ahead bits. The memory controller further reads error correction code (ECC) bits stored in the first memory array and uses the stored ECC bits to detect errors in the look-ahead bits. The memory controller detects errors by determining which look-ahead bits have flipped logical states (e.g., from a logical "1" to a logical "0" and vice-versa) due to high temperatures or EMI. The stored ECC bits may include Hamming codes, Bose, Chaudhuri, and Hocquenghem (BCH) codes, parity bits, Reed-Solomon codes, Turbo codes, low-density parity-check codes (LDPC), convolutional codes, or any other error correction codes known in the art. In some embodiments, the memory controller determines the number of defective data bits per storage unit.

The memory controller determines the number of defective look-ahead bits during various stages of memory system operation. For example, the memory controller may determine the number of defective look-ahead bits during a read cycle, in response to power up of the memory system after a high-temperature event, during an idle mode of the memory system after a high-temperature event, or in response to a received command after a high-temperature event. In the case of an idle mode, the memory controller may determine the number of defective look-ahead bits during a single idle mode or during a predetermined number of idle modes. Accordingly, the memory controller performs the error detection when impact to system performance is minimal. In the case of a power up, the memory controller may determine the number of defective look-ahead bits in response to a single power up or a predetermined number of power ups. The predetermined number of power ups may be determined using various criteria. For example, the number of power ups may be determined based on the expected number of power cycles after high-temperature events the memory system will experience during production testing or manufacturing, or a combination thereof. Accordingly, any systematic defects in data that is preloaded into the memory system during production/manufacturing can be automatically corrected before being shipped from a production facility. In the case of a received command, the memory system may receive the command from a processing system communicatively coupled to the memory system, from a user such as a system operator or test technician/engineer, and/or from a test system such as a development or production test system. The command may be a command to perform error detection and correction, a read command, a system reset command, a power-on reset (POR) command, or a wake-up command.

In some embodiments, the memory controller includes a look-ahead controller (e.g., look-ahead controller 516 of FIG. 5) that determines a number of defective bits among the look-ahead bits stored in the first nonvolatile memory array. For example, the look-ahead controller reads the look-ahead bits from the first memory array and determines which look-ahead bits are defective.

In some embodiments, example method 700 includes comparing the number of defective look-ahead bits to a threshold number of defective look-ahead bits (720). The threshold may be determined based on a number of factors including, for example, reliability requirements of the memory system, safety requirements, customer requirements, availability of memory system resources, the size of the first memory array, etc. An example threshold number of defective look-ahead bits is 50% of the look-ahead bits stored in look-ahead cells of the first nonvolatile memory array.

The memory controller or look-ahead controller determines whether the number of defective look-ahead bits is equal to or greater than the threshold number of defective look-ahead bits (730). When it is determined that the number of defective look-ahead bits equals or exceeds the threshold number of defective look-ahead bits (730-yes), example method 700 includes refreshing the data stored in the resistive nonvolatile memory array (740). Thus, for example, when there are 32 look-ahead bits stored in the look-ahead cells of the resistive memory array and the threshold number is 50% of the stored look-ahead bits, the memory controller or look-ahead controller initiates a refresh when it determines that the number of defective look-ahead bits is equal to or greater than 16 bits.

The memory controller or look-ahead controller may refresh the data according to the aspects of data refresh discussed above in reference to 640 of example method 600. The memory controller or look-ahead controller may refresh the data at various stages of memory system operation. For example, the memory controller or look-ahead controller may refresh the data immediately after determining the number of defective look-ahead bits equals or exceeds the threshold (730). As another example, the memory controller or look-ahead controller may refresh the data in response to a subsequent power up of the memory system (e.g., the next power up), or during a subsequent idle mode of the memory system (e.g., the next idle mode).

When it is determined that the number of defective look-ahead bits is less than the threshold number of defective look-ahead bits (730-no), the memory controller or look-ahead controller does not perform the data refresh and does not write the data stored in the second nonvolatile memory array to the first nonvolatile memory array (750).

In the preceding specification, various exemplary embodiments and aspects have been described with reference to the accompanying drawings. It will, however, be evident that various modifications and changes may be made thereto, and additional embodiments and aspects may be implemented, without departing from the broader scope of the invention as set forth in the claims that follow. The specification and drawings are accordingly to be regarded in an illustrative rather than restrictive sense.

The elements in the claims are to be interpreted broadly based on the language employed in the claims and not limited to examples described in the present specification or during the prosecution of the application, which examples are to be construed as non-exclusive. Further, one skilled in the art will understand from the above disclosure that the operations of the disclosed methods can be modified in any manner, including by reordering operations and/or inserting or deleting operations. It is intended, therefore, that the specification and examples be considered as example only, with a true scope and spirit being indicated by the following claims and their full scope of equivalents.

What is claimed is:

1. A memory system, comprising:
   a resistive nonvolatile memory array;
   a memory array; and
   a memory controller configured to:
      read data stored in the resistive nonvolatile memory array;
      write the data read from the resistive nonvolatile memory array, and an indicator bit to the memory array, the indicator bit indicating whether data stored in the memory array are valid;
      determine whether the indicator bit is valid; and
      write the data stored in the memory array to the resistive nonvolatile memory array when the indicator bit is valid.

2. The memory system of claim 1, wherein the resistive nonvolatile memory array is formed by at least one of a phase change random access memory (PCRAM), a resistive random access memory (RRAM), conductive-bridging random access memory (CBRAM), or a magnetic random access memory (MRAM).

3. The memory system of claim 1, wherein the memory array includes a transistor-based nonvolatile memory array, the transistor-based nonvolatile memory array being formed by at least one of a programmable read-only memory (PROM), an electrically programmable read-only memory (PROM), a flash memory, an electrically erasable programmable read-only memory (EEPROM), or an eFUSE memory.

4. The memory system of claim 3, wherein the memory controller is configured to write the data stored in the memory array to the resistive nonvolatile memory array in response to a power up of the memory system.

5. The memory system of claim 1, wherein the memory controller is configured to determine whether the indicator bit is valid in response to a high-temperature event including at least one of an environmental stress screening thermal cycle, a wave soldering process, a reflow soldering process, or a highly accelerated life test.

6. The memory system of claim 1 wherein:
   the resistive nonvolatile memory array is further configured to store look-ahead bits; and
   the memory controller is further configured to:
      determine a number of defective bits among the look-ahead bits in response to a power up of the system after a high-temperature event, a received command after a high-temperature event, a predetermined number of power ups, or a predetermined number of received commands;
      compare the number of defective look-ahead bits to a threshold number of defective look-ahead bits; and
      write the data stored in the memory array to the resistive nonvolatile memory array when the number of defective look-ahead bits equals or exceeds the threshold number of defective look-ahead bits.

7. The memory system of claim 6, wherein the memory controller is configured to determine the number of defective bits using error correction codes, the error correction codes including one of Hamming codes, Bose Chaudhuri and Hocquenghem (BCH) codes, parity bits, Reed-Solomon codes, Turbo codes, low-density parity-check codes (LDPC), or convolutional codes.

8. The memory system of claim 1, wherein the memory controller is further configured to not write the data stored in the memory array to the resistive nonvolatile memory array when the memory controller determines the indicator bit is invalid.

9. The memory system of claim 1, wherein the memory controller is configured to:
   write a plurality of indicator bits to the memory array, each of the plurality of indicator bits associated with a portion of the data stored in the memory array, and each portion of the data stored in the memory array comprising at least one of a page, sector, word, or block;
   determine whether the plurality of indicator bits are valid;
   determine that the indicator bits associated with first portions and second portions of data stored in the memory array are valid and invalid, respectively;
   write the first portions of the data stored in the memory array to the resistive nonvolatile memory array; and
   not writing the second portions of the data stored in the memory array to the resistive nonvolatile memory array.

10. The memory system of claim 1, wherein the memory controller is configured to write the data stored in the memory array to the resistive nonvolatile memory array during an idle mode of the memory system.

11. A method for managing data in a memory system, comprising:
    reading data of a resistive nonvolatile memory array;
    writing the data of the resistive nonvolatile memory array and an indicator bit to a memory array, the indicator bit indicating whether data of the memory array is valid;
    determining whether the indicator bit is valid; and
    writing the data of the memory array to a resistive nonvolatile memory array when the indicator bit is determined to be valid.

12. The method of claim 11, including providing the memory array as a transistor-based nonvolatile memory array, the transistor-based nonvolatile memory array being formed by at least one of a programmable read-only memory (PROM), an electrically programmable read-only memory (EPROM), a flash memory, an electrically erasable programmable read-only memory (EEPROM), or an eFUSE memory.

13. The method of claim 11, wherein writing the data of the memory array to the resistive nonvolatile memory array includes writing the data of the memory array to the resistive nonvolatile memory array in response to a power up of the memory system.

14. The method of claim 11, wherein determining whether the indicator bit is valid after a high-temperature event includes determining whether the indicator bit is valid after at least one of an environmental stress screening thermal cycle, a wave soldering process, a reflow soldering process, or a highly accelerated life test.

15. The method of claim 11, further comprising:
determining a number of defective bits among the look-ahead bits stored in the resistive nonvolatile memory array in response to a power up of the system after a high-temperature event, a received command after a high-temperature event, a predetermined number of power ups, or a predetermined number of received commands;
comparing the number of defective look-ahead bits to a threshold number of defective look-ahead bits; and
writing the data of the memory array to the resistive nonvolatile memory array when the number of defective look-ahead bits equals or exceeds the threshold number of defective look-ahead bits.

16. The method of claim 15, wherein determining a number of defective bits among the look-ahead bits includes determining a number of defective bits using error correction codes, the error correction codes including one of Hamming codes, Bose Chaudhuri and Hocquenghem (BCH) codes, parity bits, Reed-Solomon codes, Turbo codes, low-density parity-check codes (LDPC), or convolutional codes.

17. The method of claim 11, further comprising:
not writing the data of the memory array to the resistive nonvolatile memory array when the indicator bit is determined to be invalid.

18. The method of claim 11, wherein:
writing the indicator bits includes writing a plurality of indicator bits to the memory array, each of the plurality of indicator bits associated with a portion of the data of the memory array, and each portion of the data of the memory array comprising at least one of a page, sector, word, or block;
determining whether the indicator bit is valid includes determining whether the plurality of indicator bits are valid;
determining that the indicator bits associated with first portions and second portions of data of the memory array are valid and invalid, respectively;
writing the first portions of the data of the memory array to the resistive nonvolatile memory array; and
not writing the second portions of the data of the memory array to the resistive nonvolatile memory array.

19. The method of claim 11, wherein writing the data of the memory array to the resistive nonvolatile memory array includes writing the data of the memory array to the resistive nonvolatile memory array during an idle mode of the memory system.

* * * * *